(12) United States Patent
Archer

(10) Patent No.: US 7,330,704 B2
(45) Date of Patent: Feb. 12, 2008

(54) ELECTRICAL SIGNAL PRE-CONDITIONING

(75) Inventor: Nicholas David Archer, West Yorkshire (GB)

(73) Assignee: Filtronic PLC, Shipley (GB)

( * ) Notice: Subject to any disclaimer, the term of this patent is extended or adjusted under 35 U.S.C. 154(b) by 405 days.

(21) Appl. No.: 10/476,088

(22) PCT Filed: Apr. 25, 2002

(86) PCT No.: PCT/GB02/01842

§ 371 (c)(1),
(2), (4) Date: Jul. 7, 2004

(87) PCT Pub. No.: WO02/089315

PCT Pub. Date: Nov. 7, 2002

(65) Prior Publication Data

US 2004/0246639 A1    Dec. 9, 2004

(30) Foreign Application Priority Data

Apr. 25, 2001 (GB) ................. 0110106.2

(51) Int. Cl.
    *H04B 1/04* (2006.01)
(52) U.S. Cl. ............... 455/114.3; 455/127.1; 375/297; 330/2; 330/149
(58) Field of Classification Search ......... 455/126, 455/114.2–114.3, 91, 63.1, 127.1; 375/296–297; 330/2, 149; 341/118, 120, 138
See application file for complete search history.

(56) References Cited

U.S. PATENT DOCUMENTS

| 4,737,725 A | * | 4/1988 | Wood ................. 327/318 |
| 5,638,403 A | | 6/1997 | Birchler et al. .......... 375/296 |
| 5,740,520 A | * | 4/1998 | Cyze et al. ................. 455/69 |
| 6,049,703 A | * | 4/2000 | Staudinger et al. ....... 455/114.3 |
| 6,112,062 A | * | 8/2000 | Hans et al. .............. 455/114.3 |
| 6,175,270 B1 | * | 1/2001 | Vannucci ..................... 330/2 |
| 6,314,146 B1 | * | 11/2001 | Tellado et al. ............. 375/346 |
| 6,480,704 B1 | * | 11/2002 | Pakonen .................... 455/126 |
| 6,504,862 B1 | * | 1/2003 | Yang ......................... 375/146 |
| 6,621,340 B1 | * | 9/2003 | Gerhaeuser et al. ........ 330/149 |
| 6,624,694 B2 | * | 9/2003 | Ma et al. ................... 330/126 |
| 6,654,427 B1 | * | 11/2003 | Ma et al. ................... 375/297 |
| 6,931,239 B2 | * | 8/2005 | Hongo et al. .............. 455/103 |
| 7,170,346 B2 | * | 1/2007 | Jelonnek et al. ........... 330/151 |
| 7,170,951 B1 | * | 1/2007 | Perthold et al. ............ 375/296 |
| 7,225,389 B2 | * | 5/2007 | Tsuchie ..................... 714/774 |
| 2004/0014437 A1 | * | 1/2004 | Gerhaeuser et al. ..... 455/114.3 |

FOREIGN PATENT DOCUMENTS

| EP | 0 940 911 | | 9/1999 |
| EP | 1 073 196 | | 1/2001 |
| EP | 1 195 892 | | 4/2002 |
| GB | 2346773 | * | 8/2000 |

* cited by examiner

*Primary Examiner*—Edward F. Urban
*Assistant Examiner*—RuiMeng Hu
(74) *Attorney, Agent, or Firm*—Marc Karish; Sheldon Mak Rose & Anderson

(57) ABSTRACT

A method and circuitry for pre-conditioning an electrical signal. The method comprises limiting the strength of the signal to not exceed a limit signal strength corresponding to the onset of substantial non-linear response of an amplifier to which the limited signal is to be supplied for amplification.

6 Claims, 6 Drawing Sheets

ELECTRICAL SIGNAL PRE-CONDITIONING

CROSS-REFERENCE TO RELATED APPLICATIONS

This application claims the benefit of International Patent Application PCT/GB02/01842, filed 25 Apr. 2002, entitled "Electrical Signal Pre-conditioning"; which claims the benefit of Great Britain Application 0110106.2, filed 25 Apr. 2001, the entire contents of which are hereby incorporated herein by reference.

BACKGROUND

The present invention relates to pre-conditioning an electrical signal, and in particular to a method and apparatus for pre-conditioning an electrical signal to compensate for the effect of a non-linear amplifier on the signal.

An amplifier tends to exhibit substantially linear response to an input signal over a limited range. When an input signal has a large variation in amplitude, the amplifier generates distortion in the output signal, as a result of its non-linear behavior, for those parts of the input signal exceeding a signal level corresponding to the onset of substantial non-linear behavior.

This problem can be addressed by producing an amplifier with linear behavior over an extended range. However, to ensure that significant distortion will not be generated, it is necessary to know the maximum input signal strength, so as to be sure that the amplifier range is sufficient.

SUMMARY OF THE INVENTION

The present invention therefore addresses the problems associated with distortion generated by non-linear amplifiers.

According to a first aspect of the present invention, there is provided a method of pre-conditioning an electrical signal comprising the step of limiting the strength of the signal to not exceed a limit signal strength corresponding to the onset of substantial non-linear response of an amplifier to which the limited signal is to be supplied for amplification.

By limiting an electrical signal to below a selected signal strength distortion generated by the non-linear response of an amplifier can be reduced.

The method can include the step of filtering the limited signal prior to amplification.

The method can include the step of amplifying the limited signal. The method can include the further step of supplying the amplified signal to a telecommunications broadcast apparatus. This allows a telecommunications signal to be transmitted without generating significant distortion in adjacent telecommunications channels.

The method can include the step of amplifying the limited signal. The method can include the further step of supplying the amplified signal to telecommunications broadcast apparatus. This allows a telecommunications signal to be transmitted without generating significant distortion in adjacent telecommunications channels.

The method can include the step of producing a difference signal corresponding to the difference between the electrical signal and the limited signal. The method can include the further step of filtering the difference signal. The difference signal can be filtered to remove frequency components of the signal falling within a frequency band of interest.

The method can include the step of combining a filtered difference signal and the limited signal. The filtered difference signal can be removed from the limited signal.

The method can include the step of iterating the pre-conditioning of the electrical signal prior to amplifying the signal. This allows the pre-conditioned signal to converge on a preferred signal strength.

The limit signal strength can be varied responsive to the strength of the electrical signal to be pre-conditioned. This allows the pre-conditioning to be adaptive by setting the signal limit as a function of the strength of the signal to be pre-conditioned.

The limit signal strength can be set at a value to prevent the pre-conditioned signal strength from exceeding the signal strength corresponding to the actual onset of substantial non-linear response. This allows the pre-conditioning step to ensure that the pre-conditioned signal does not exceed a preferred maximum signal strength for the amplifier.

The electrical signal can be a telecommunications signal for broadcast.

According to a further aspect of the invention, there is provided an electrical pre-conditioning circuit for pre-conditioning an electrical signal prior to amplification by an amplifier having an onset of substantial non-linear response, the circuit including a limiter for limiting the strength of the electrical signal to below a limit signal strength corresponding to the onset of substantial non-linear response.

The components of the circuit can be implemented by a digital signal processor. A digital signal processor can be used to provide the functionalities of electrical components required to provide the pre-conditioning method. Feedback circuitry can be provided to implement an iteration feature of the method. Adaptive limit level control circuitry can be provided to implement an adaptive control of the signal limit.

According to a further aspect of the invention, there is provided telecommunications apparatus, including a pre-conditioning circuit according to a previous aspect of the invention and an amplifier for amplifying the pre-conditioned signal. The apparatus can include a pre-distorter which pre-distorts the pre-conditioned signal prior to amplification and a filter which filters the output of the amplifier.

BRIEF DESCRIPTION OF THE DRAWINGS

An embodiment of the invention will now be described, by way of example only, and with reference to the accompanying drawings, in which.

Figure 1:
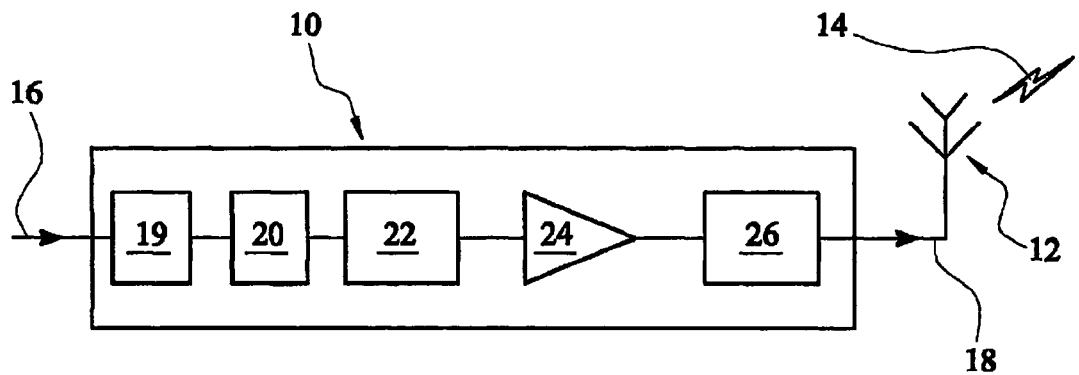
FIG. 1 shows a schematic block diagram of the transmit part of a telecommunications base-station including circuitry operating according to the method of the present invention.

Similar items in different Figures share common reference numerals unless indicated otherwise.

DETAILED DESCRIPTION

With reference to FIG. 1 there is shown a schematic representation of a base-station 10 for a telecommunications system connected to an antenna 12 for broadcasting electromagnetic telecommunication signals 14. The basestation 10 includes transmit and receive parts. FIG. 1 shows the transmit parts relevant to describing the invention only. The other conventional parts of the basestation have not been shown for the sake of clarity only. The transmit part of the base-station 10 includes a number of electronic devices for processing an input electrical signal 16 into an output electrical signal 18 for supply to the broadcast antenna 12 for transmission. The base-station includes a modulator 19, a pre-conditioning device 20, a pre-distortion device 22, a power amplifier 24 and a filter 26.

The signal processing components of the base-station are suitable for processing electrical telecommunication signals employing amplitude modulation encoding or complex encoding: i.e. amplitude and phase modulation. The following discussion will focus on a telecommunications system utilizing a CDMA encoding scheme, although the circuitry and method described are applicable to any electrical signal with amplitude modulation having a high peak to average ratio.

Modulator 19 is substantially conventional and handles other functions of the transmit part of the base-station prior to the pre-conditioning stage. The pre-distortion device 22 is of substantially conventional design and the application of a pre-distortion stage to improve the linear behavior of a non-linear amplifier is well understood in this art. The amplifier 24 is a conventional power amplifier which exhibits a substantially linear response up to an input signal power level after which significant non-linear response is exhibited. The filter 26 is a substantially conventional design high power RF filter. However, the filter characteristic of the filter 26 will be determined by the telecommunications scheme under which the base-station operates so as to provide an acceptable level of distortion out of the telecommunications signal band over which the telecommunications signal 14 is being broadcast.

For example, under a current CDMA scheme, a GHz part of the broadcast spectrum is divided into bands, with each band having a substantially 5 MHz width and each broadcaster must not generate distortion in neighbouring bands above levels defined as acceptable by the telecommunications standards in force at the time. Hence, the filter characteristic of filter 26 is selected to ensure that the out of band distortion reaches the telecommunications standard criterion.

Figure 2:
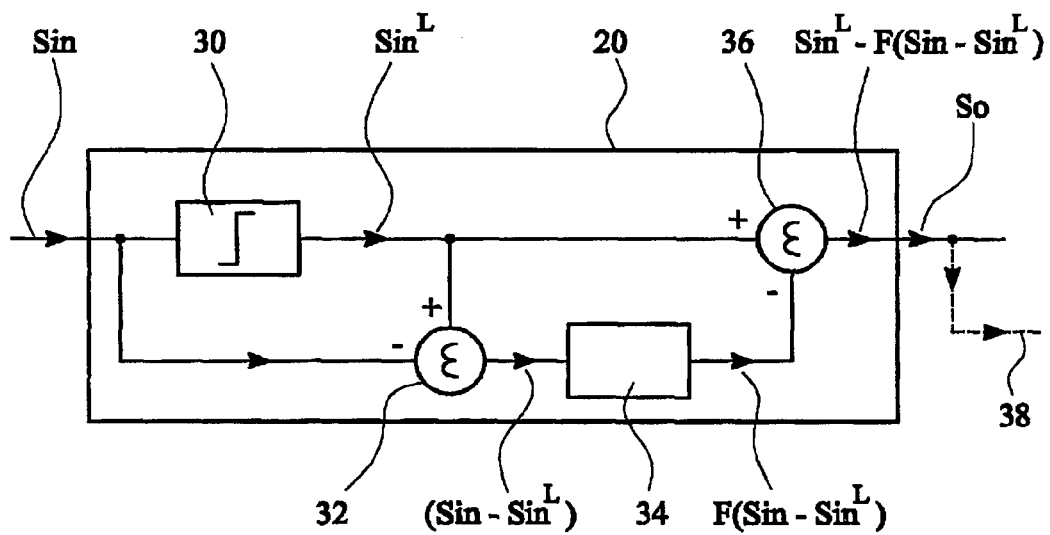
FIG. 2 shows a schematic functional block diagram of electronic circuitry according to the present invention.

FIG. 2 shows a schematic functional block diagram of the signal pre-conditioning device 20. The pre-conditioning device 20 is implemented by a digital signal processor. FIG. 2 schematically illustrates the functionality supported by the digital signal processor and should be read accordingly. The pre-conditioning circuitry includes a limiter or clipper component 30 which limits or clips the amplitude of an electrical signal to a maximum value. An input electrical telecommunications signal $S_{in}$ is supplied as an input to a limiter 30 and a limited or clipped signal $S_{in}^{L}$ is output therefrom.

The pre-conditioning circuitry also includes a combining component 32 to which $S_{in}$ and $S_{in}^{L}$ are supplied. The combining component 32 subtracts $S_{in}^{L}$ from $S_{in}$. It will be appreciated that a subtracting function is merely a matter of sign convention and that adding a negative quantity is equivalent to subtracting a positive quantity. A filter 34 is also provided to which the difference signal $S_{in}-S_{in}^{L}$ is supplied. The pre-conditioning circuitry includes a further combining component 36 to which the signal $S_{in}^{L}$ and the filtered difference signal $F(S_{in}-S_{in}^{L})$ are supplied. Combining component 36 subtracts the filtered difference signal from the clipped signal, subtraction again being a matter of sign convention, and generates a pre-conditioned output signal $S_o$.

The method of operation of pre-conditioning device 20 will now be further described with reference to FIGS. 3 to 6. FIGS. 3 to 6 are similar graphs showing the amplitude, or envelope, of the electrical signal at different stages of processing by the pre-conditioning circuit 20 as a function of time. FIGS. 3 to 6 also show the same electrical signal in the frequency domain as a function of the frequency of the signal as a proportion of the Nyquist frequency. The frequency domain graphs are fast Fourier transforms of the time domain signals. The frequency domain graphs show the positive frequency part of the baseband spectrum.

In general, a baseband signal is one that has been modulated ready for transmission and has a mean frequency of zero. In this example, the signal is translated to high frequency (approximately 900 MHz or 1800 MHz) before final transmission, but the amplitude, phase and spectral shape relative to the high frequency carrier signal are the same as those of the baseband signal relative to zero frequency. In this case, the signal mean frequency is the high frequency carrier signal which corresponds to zero in the baseband version. At baseband, the mathematical convenience of negative frequencies is required, which is why the frequency domain graphs show only the positive half of the spectrum.

Preconditioning of the signal is applied at baseband before translation to high frequency, but will limit the amplitude of the high frequency signal in the same way. Similarly, the first action of a receiver will be to translate the signal back to baseband before further processing.

Figure 3A:
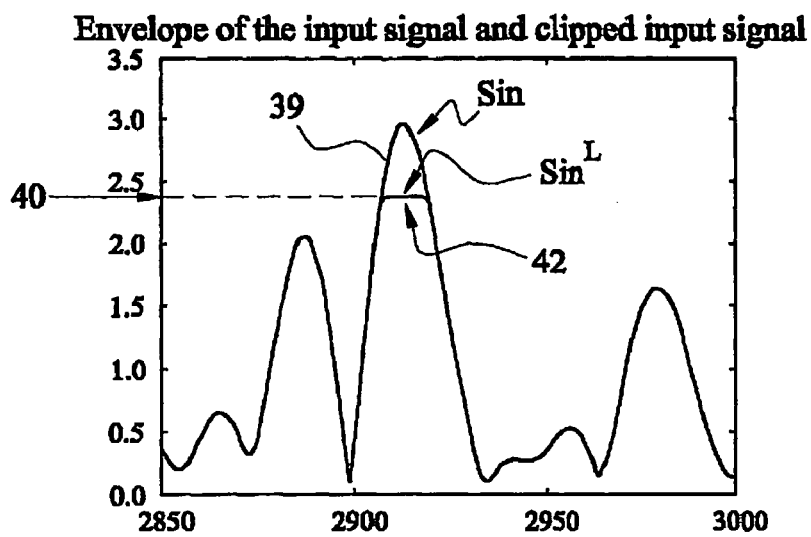
FIGS. 3a, b, and c respectively show graphs illustrating the behavior of the electrical signals being processed according to the method of the invention in the time and frequency domains.
Figure 3B:
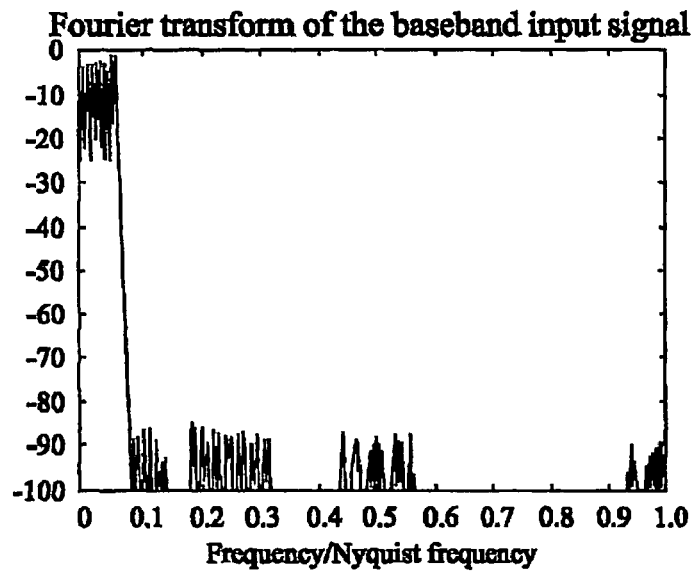

FIG. 3a shows part of the envelope 39 of the input signal $S_{in}$ as a function of time, from which it can be seen that the amplitude of the input signal $S_{in}$ varies substantially over a microsecond time frame and so the power of the signal passes through peaks and troughs. This signal has a high peak to average ratio. The amplifier 24 has an acceptably linear behavior up to a threshold signal strength corresponding to the onset of substantial non-linear response of the amplifier. This onset signal strength is indicated in FIG. 3a as signal strength or amplitude, 40. FIG. 3b shows the positive frequency components of the baseband input signal $S_{in}$.

Figure 3C:
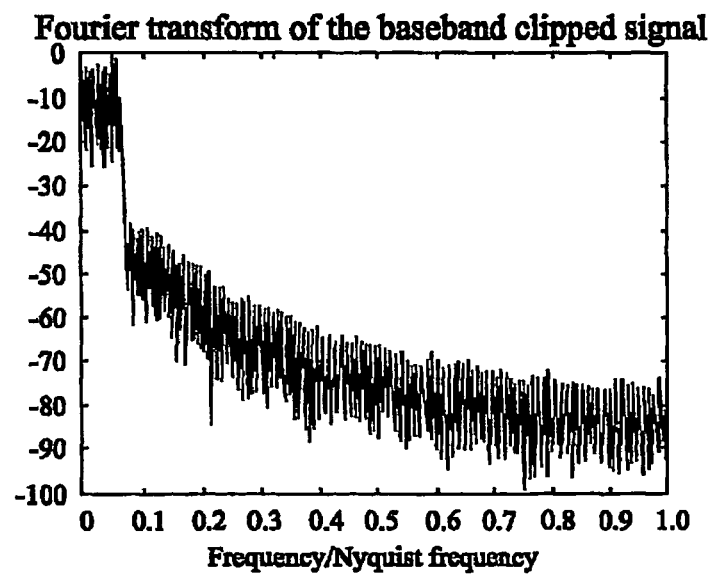

Input signal $S_{in}$ is passed to the limiter 30 which limits the amplitude of $S_{in}$ to below the maximum signal strength 40 and results in the envelope of the input signal being clipped 42 as shown in FIG. 3a. FIG. 3c shows the positive part of the Fourier transform of the baseband clipped signal, from which it can be seen that clipping the input signal introduces frequency components of the signal that were not present in the original input signal $S_{in}$.

Figure 4A:
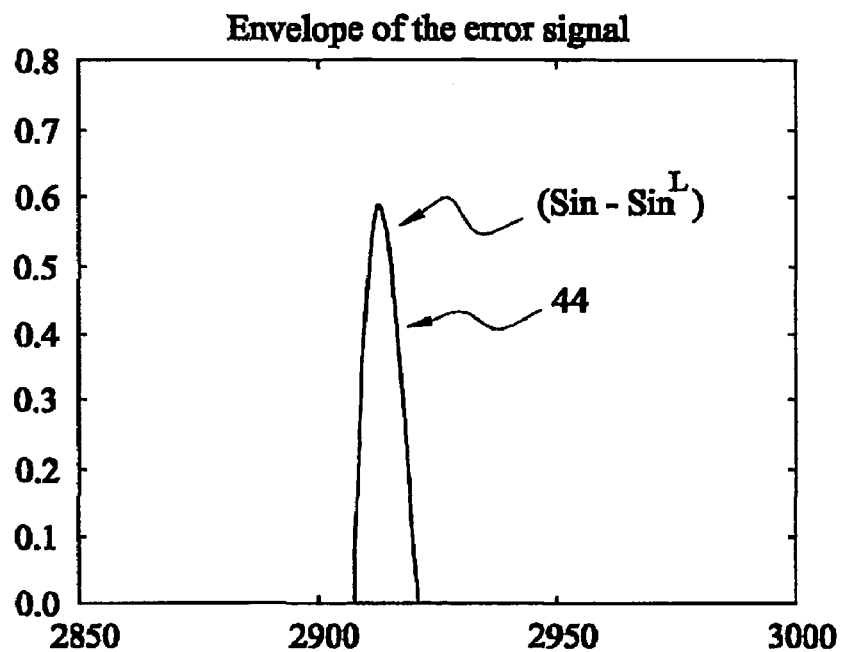
FIGS. 4a & b, 5a & b and 6a & b respectively show graphs illustrating the further behavior of the electrical signals being processed according to the method of the invention in the time and frequency domains.
Figure 4B:
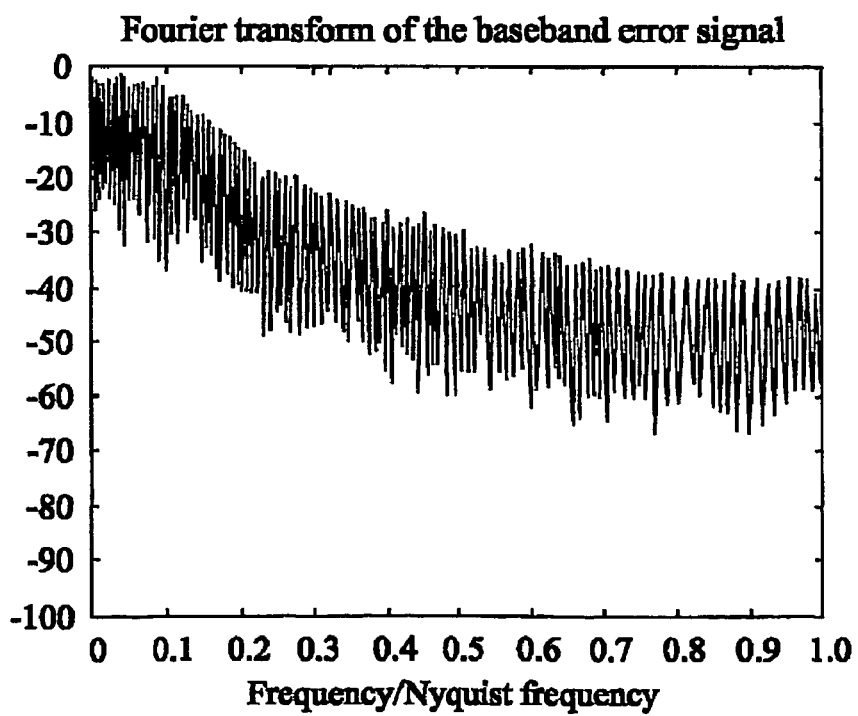

The clipped or limited signal $S_{in}^{L}$ is then passed to the first combiner component 32. The unclipped input signal $S_{in}$ is also supplied to the first combiner component and a difference signal $(S_{in}-S_{in}^L)$ 44 is generated. FIGS. 4a and 4b respectively show the difference signal in the time 44 and frequency 46 domains. It should be noted that the scales of the ordinate axis in FIGS. 3a and 4a differ. The difference signal is essentially that part of the input signal removed by the clipping operation.

Figure 5A:
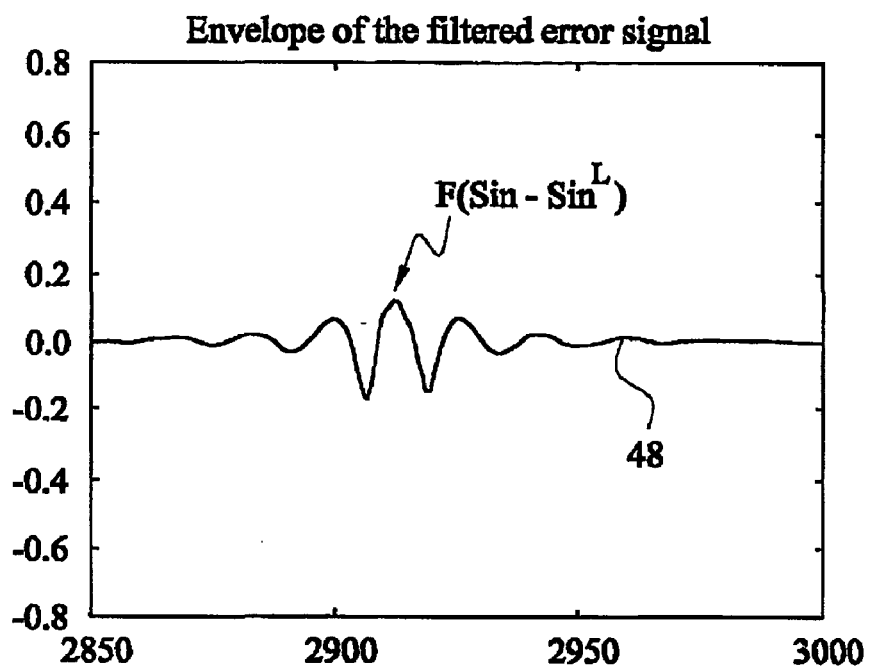
Figure 5B:
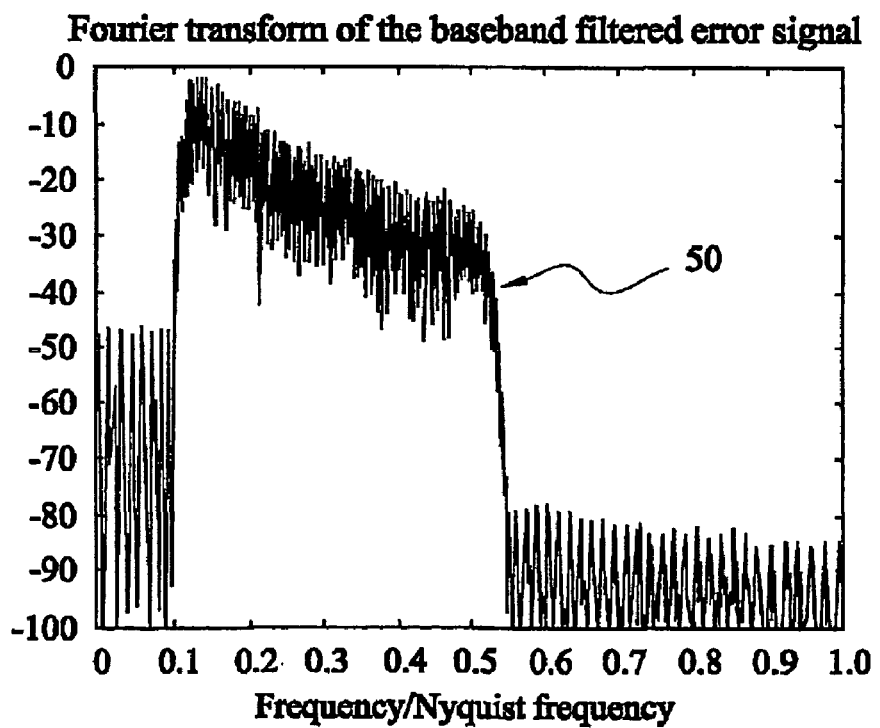

The difference signal $(S_{in}-S_{in}^L)$ is then passed to filter 34, the filtered output of which $F(S_{in}-S_{in}^L)$ is illustrated in the time 48 and frequency 50 domains by FIGS. 5a and 5b respectively. The characteristics of filter 34 are chosen to select from the difference signal only those frequency components that are to be removed from the limited signal to provide the final pre-conditioned signal. In this case the filter selects an amount of the difference signal overlapping the edge of the communications signal and a large amount corresponding to the out of band signal. This can best be seen by a comparison of FIGS. 3b and 5b in which it can be seen that the result of filtering the difference signal is to generate a signal having substantial signal strength over a frequency range adjacent to the edge of the frequency band of interest while the signal strength within the band is low.

In general, the characteristics of filter 34 will be determined by the application of the preconditioning circuitry and method. The filter 34 is used to select the part of the spectrum that will be used to correct the limited signal by the final summation stage 36. The filter may have arbitrary positioning of the passbands with arbitrary width confined only by the amount of energy contained in the difference signal. The level of energy in the difference signal determines how much the pre-conditioner output signal will exceed the original limit 40. The passbands of the filter 34 are chosen to optimize the final pre-conditioned signal with respect to the various in-band and out-of-band specifications. The optimal solution will be one where all the specifications are equally well met.

If one specification is harder to meet than another, then correction can be concentrated on that specification, so that the amplifier may be driven harder while still meeting all the specifications. In this particular example, the out-of-band distortion specification is harder to meet and so is corrected at the expense of distortion elsewhere: in band, in this case. The opposite can be required and attained; ie the in-band distortion can be improved at the expense of the out-of-band distortion, if that is required by the specifications of a particular application. The exact design of the filter characteristics is a careful optimization and will depend on the signal to be pre-conditioned and the specifications.

Figure 6A:
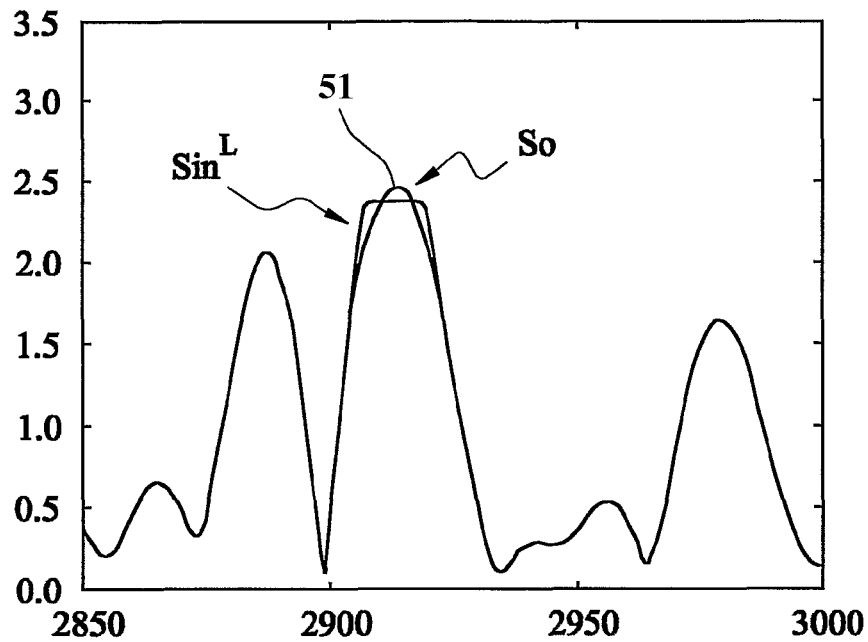
Figure 6B:
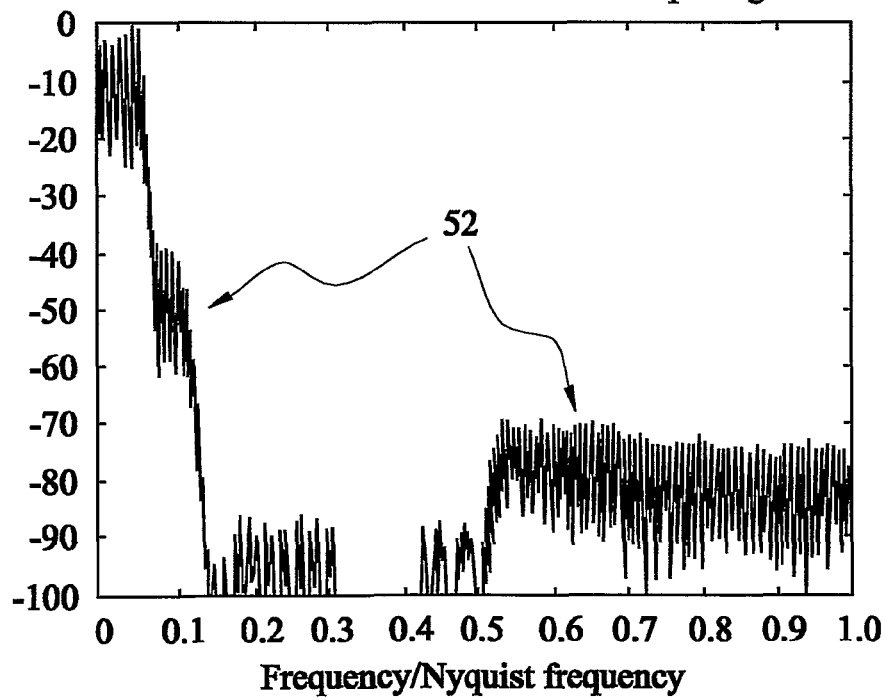

The filtered difference signal is then passed to combining component 36 which subtracts the filtered difference signal from the clipped input signal $S_{in}^L$ to generate output signal $S_o$. The result of this operation is illustrated in FIGS. 6a and 6b. As can be seen, the output signal $S_o$ 51 is substantially the same as input signal $S_{in}$ except around the clipped peak. The effect of subtracting the filtered difference signal from the clipped input signal is to reduce the amplitude of the input signal which exceeds the onset of non-linearity of the amplifier, without significantly affecting the amplitude of the input signal below that level. As can be seen by comparison of FIGS. 3b and 6b, the pre-conditioning method adds spectral weight 52 to the input signal away from the signal band of interest.

Figure 7:
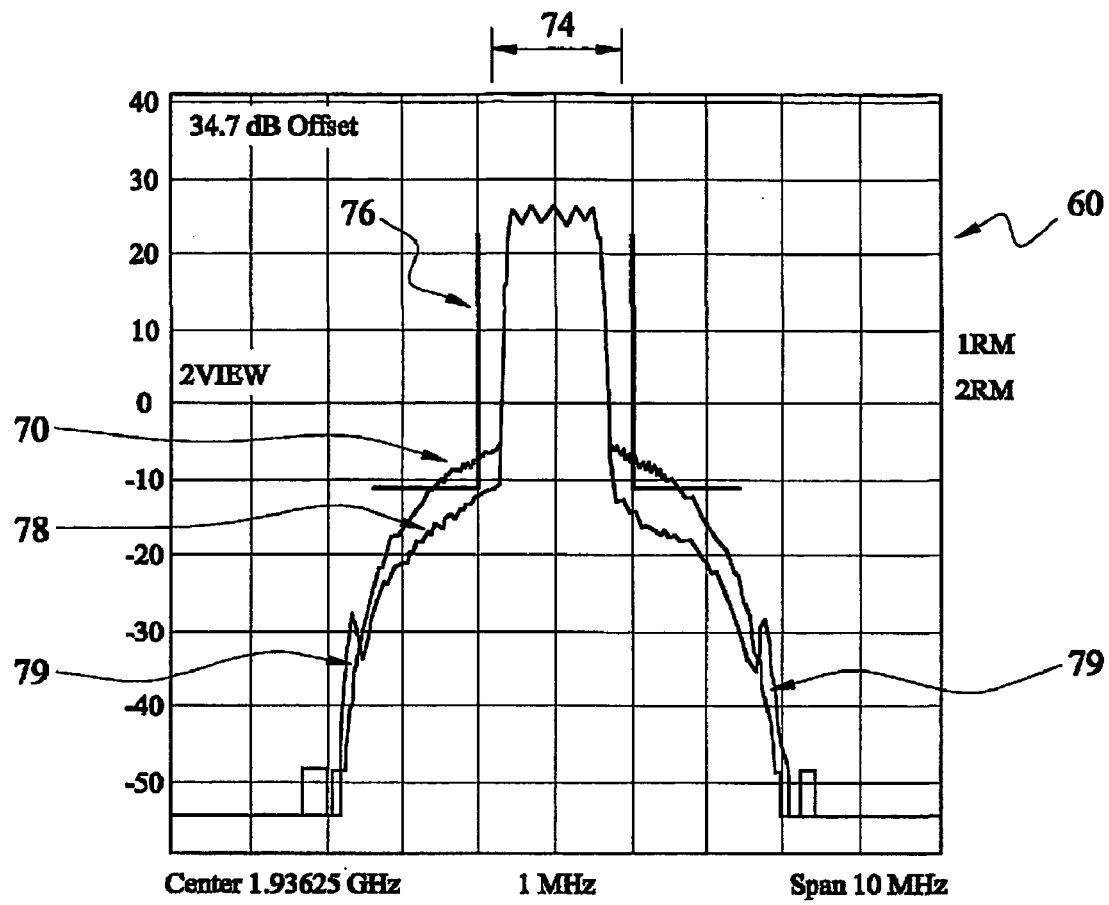
FIG. 7 shows a graph illustrating the effect of the method of the invention on signals to which the method has and has not been applied.

FIG. 7 shows a graph 60 showing the amplified signal strength as a function of frequency with and without application of the pre-conditioning method. Plot 70 shows the output of amplifier 24 without the pre-conditioning operation. As can be seen, the non-linear response of the amplifier to input signals above the threshold for onset of substantial non-linear behavior results in significant distortion out of the telecommunications band 74 of interest. Plot 78 illustrates the effect of the preconditioning stage on the amplified signal output by amplifier 24. As can be seen, there is no significant degradation of the in band signal. However the out of band distortion has been significantly reduced (by approximately 6 dB) in areas adjacent either side of the in band region 74. There is an increase in distortion in the far wings 79 of the amplified pre-conditioned signal. However, these are suppressed easily by the filter 26 to −28 dBm which is inside the specified limits.

The reduction in out of band distortion provided by the pre-conditioning step means that the characteristic of filter 26 does not need to have as sharp a bandpass characteristic 76 in order to meet the out of band distortion signal requirements of the telecommunications system as would be required in the absence of the pre-conditioning step. The pre-conditioning step has already reduced the out of band distortion significantly.

The system described above is particularly suitable in circumstances where there are a number of closely spaced telecommunications channels and it is important to prevent distortion from one channel impinging on the telecommunications signals present in an adjacent channel.

Figure 8:
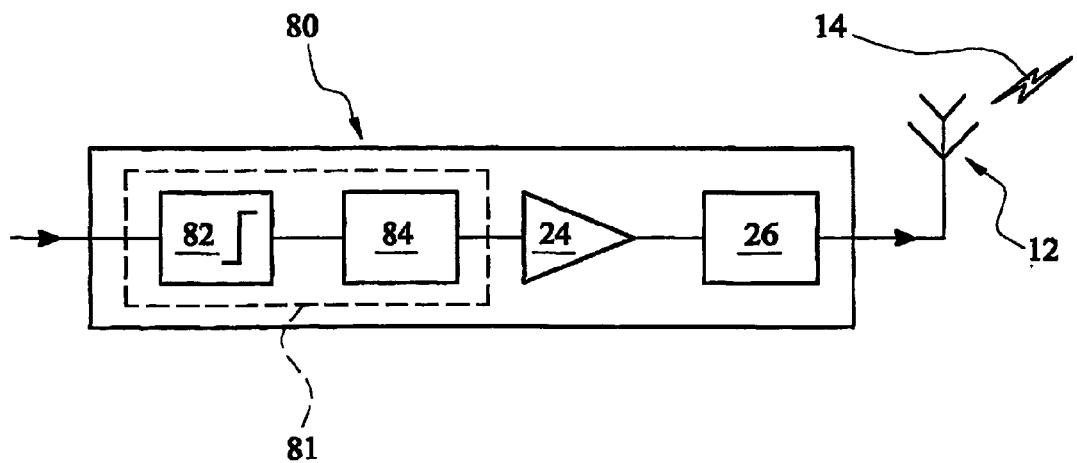
FIG. 8 shows a schematic block diagram of a further circuit operating according to the method of the invention.

FIG. 8 shows an implementation of the invention, which can be used when all of the correction to be applied affects energy outside the original signal and sufficiently far away from the original signal that the design of a filter stage is practical.

With reference to FIG. 8 there is shown the transmit parts of a further base-station 80 for amplifying electrical telecommunication signals prior to transmission. The transmit parts will in practice include further conventional components and can include a modulator, pre-distortion stage and output filter stage, as shown in FIG. 1, although they have not been shown in FIG. 8 for the sake of clarity. The transmit parts required to explain the invention and shown in FIG. 8, comprises pre-conditioning circuitry 81, comprising a limiter 82 and a filter 84 realised by digital signal processing. Again, the input signal is an electrical telecommunications signal having a high peak to average ratio. An amplifier 24 and high power RF filter stage 26 are provided.

The pre-conditioning circuitry 81 is particularly suitable for applications in which it is not as important to reduce distortion very close to the band edge, but rather out-of-band distortion away from the band edges.

Figure 9:
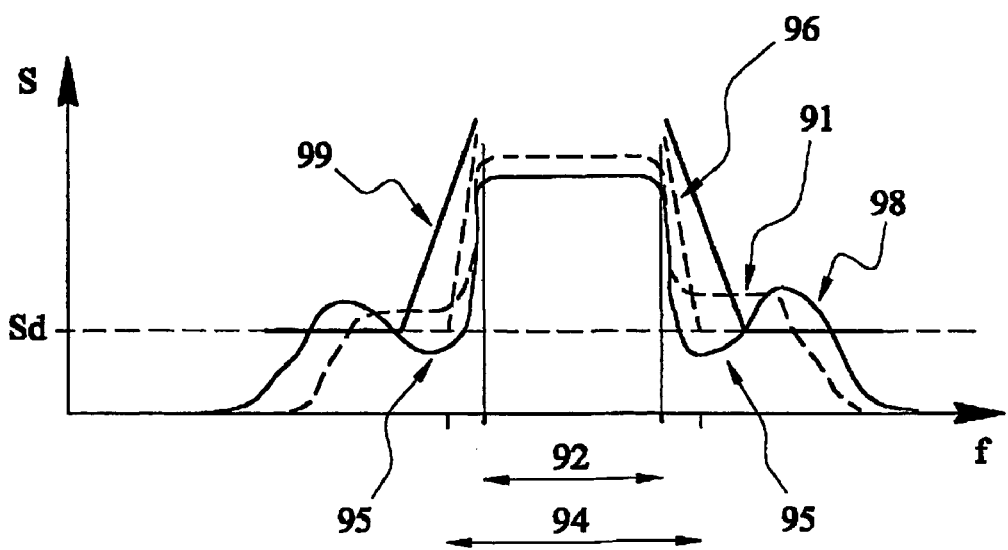
FIG. 9 shows a graph illustrating the effect of the circuitry of FIG. 8.

The operation of the pre-conditioning circuit 81 will now be described with reference to FIG. 9. FIG. 9 shows a graph of the output signal of the amplifier 24 as a function of frequency without the pre-conditioning circuit as dashed line 91. The telecommunications system has a channel width 94 and a telecommunications signal band width 92. A telecommunications scheme specifies an out of band distortion level criterion $S_d$ which must be met by the base-station transmissions. In the absence of the pre-conditioning circuitry, the filter characteristic indicated by dashed line 96 is required in order to meet the out of band distortion level $S_d$. As will be appreciated, the pass band characteristic 96 is extremely sharp and therefore difficult technologically to implement.

By using the pre-conditioning circuitry, a less severe filter characteristic 99 for filter 26 can be used. The limiter 82 clips the input signal to limit it below a threshold value corresponding to the onset of substantial non-linear behavior by the amplifier 24. Filter 84 is used to filter out any distortion close to the information band at low power by signal processing. This means that the high power RF filter 26 can be cheaper and smaller as it does not have to be a high degree high Q filter in order to remove any distortion close to the information band. Line 98 illustrates the signal strength of the amplified clipped input signal. Clipping the signal reduces the out of band distortion 95 generated by the amplifier immediately adjacent to the edges of the band 92.

However, the corollary of clipping, as illustrated in FIG. 3c is the introduction of frequency components of the signal away from the central frequency. This is illustrated in FIG. 9 by side lobes 98 of the amplified output signal 98. However, as the clipping strength has reduced the out of band distortion immediately adjacent the band, a less severe filter characteristic for filter 26, illustrated by line 99, can be used in order to meet the out of band distortion signal level $S_d$. Such a filter characteristic is easier to implement than the filter characteristic 96 required in the absence of clipping. Although filters 84 and 26 both appear to be acting in a similar way (ie removing distortion) they are fundamentally different in that filter 84 comes before a non-linear device (ie amplifier 24) which will still generate some distortion which is why high power RF filter 26 is required after it. Whereas, filter 84 is a low power filter removing distortion very close to the information band edges pre-amplification, which prevents that distortion being amplified and thereby allows filter 84 to have a much less severe filter characteristic than would be required in its absence. Therefore filter 26 can be simpler and cheaper as it requires a lower Q.

The illustration by FIG. 9 of the performance of pre-conditioning circuitry 81, applies similarly to the performance of pre-conditioning circuitry 20, mutatis mutandis.

As shown in FIG. 6a, the pre-conditioned output signal $S_o$ can be greater than the limit signal strength selected as corresponding to the onset of significant non-linear behavior by the amplifier stage 24. Therefore, the preconditioning procedure can be iterated, as illustrated in FIG. 2 by dashed line 38, by feeding output signal $S_o$ forward to the input of a, or several, further preconditioning circuits similar to circuit 20. A single or multiple iterations can be used and two iterations have been found to produce a rapid convergence to an acceptable level.

An adaptive clipping function can also be provided in which the clipping limit 40 is set dependent on the amplitude of the input signal. The strength of the input signal $S_{in}$ is measured to determine the amount by which it exceeds a signal strength corresponding to the onset of substantial non linear behavior by the amplifier. The amount by which the input signal exceeds that level is then used to set the actual clipping level so that the more the input signal exceeds the onset strength, the lower the clipping level actually used to clip the signal. This can be used to ensure that the output pre-condition signal $S_o$ falls below the actual signal level corresponding to the onset of substantial non-linear behavior by the amplifier. The actual clipping level to be used can be determined by a calculation, using a formula stored in memory, or from a look up table stored in memory from experimental results.

The adaptive clipping feature and iteration feature can be combined so that the actual clipping level used can be changed for each iterative step.

Although the method and apparatus have been described within the context of a telecommunications system, it will be appreciated that the pre-conditioning method and circuitry of FIGS. 2 and 8 can be used to pre-condition any electrical signal having a high peak to average ratio which is to be amplified, in order to reduce non-linear amplifier related distortion adjacent the amplified signal of interest. The method and circuitry are applicable to any amplitude modulated electrical signal, including complexly modulated signals in which both amplitude and phase are used to encode information.

Although the above description of the invention has been in the context of a digital signal processing implementation at baseband, the preconditioning signal processing could be carried out using analogue components at baseband, some intermediate frequency (IF), or even radio frequency (RF).

The invention claimed is:

1. A method of pre-conditioning an electrical signal prior to amplification by an amplifier, the electrical signal comprising a communication signal within a communication band, the method comprising the steps of:

limiting the strength of the signal to not exceed a limit signal strength corresponding to the onset of substantial non-linear response of the amplifier to which the limited signal is to be supplied for amplification;

producing a difference signal corresponding to a difference between the electrical signal and the limited signal;

filtering the difference signal; and combining the filtered difference signal and the limited signal;

wherein the filter selects the portion of the difference signal overlapping the edge of the communication band and extending out of the communication band, and wherein the signal strength of the difference signal within the band is low compared to the signal strength of the difference signal at the band edge.

2. The method of claim 1, wherein the combined signal is provided to the amplifier and further comprising the step of filtering the signal after amplification.

3. The method of claim 1, further comprising the step of iterating the pre-conditioning of the electrical signal prior to amplifying the signal.

4. The method of claim 1, wherein the limit signal strength is varied responsive to the strength of the electrical signal to be pre-conditioned.

5. The method of claim 1, wherein the limit signal strength is set at a value to prevent the preconditioned signal strength from exceeding the signal strength corresponding to the actual onset of substantial non-linear response.

6. The method of claim 1, wherein the electrical signal is a telecommunications signal for broadcast.

* * * * *